(12) United States Patent
Nagatomo et al.

(10) Patent No.: US 8,842,710 B2
(45) Date of Patent: Sep. 23, 2014

(54) PROCESS FOR PRODUCING SEMICONDUCTOR DEVICE AND SEMICONDUCTOR DEVICE

(75) Inventors: Yasuhiro Nagatomo, Kawasaki (JP); Takeshi Kawashima, Tokyo (JP); Katsuyuki Hoshino, Tokyo (JP); Shoichi Kawashima, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 364 days.

(21) Appl. No.: 13/058,561

(22) PCT Filed: Jul. 27, 2010

(86) PCT No.: PCT/JP2010/062983
§ 371 (c)(1),
(2), (4) Date: Feb. 11, 2011

(87) PCT Pub. No.: WO2011/013836
PCT Pub. Date: Feb. 3, 2011

(65) Prior Publication Data
US 2011/0134956 A1      Jun. 9, 2011

(30) Foreign Application Priority Data

Jul. 30, 2009    (JP) .................................. 2009-178412

(51) Int. Cl.
| | | |
|---|---|---|
| H01S 3/08 | (2006.01) | |
| H01L 21/02 | (2006.01) | |
| H01S 5/20 | (2006.01) | |
| H01S 5/12 | (2006.01) | |
| H01S 5/323 | (2006.01) | |
| H01S 5/10 | (2006.01) | |

(52) U.S. Cl.
CPC ............ H01S 5/1228 (2013.01); *H01S 5/2059* (2013.01); *H01S 5/1231* (2013.01); *H01S 5/32341* (2013.01); *H01S 5/1017* (2013.01); H01L 21/02579 (2013.01); *H01S 5/2095* (2013.01); H01L 21/0254 (2013.01); H01L 21/02538 (2013.01); H01L 21/02667 (2013.01); H01L 21/02389 (2013.01)
USPC ............. 372/102; 438/46; 438/478; 438/503; 438/505; 438/507; 438/508; 438/509

(58) Field of Classification Search
CPC ... H01S 5/1228; H01S 5/1231; H01S 5/3241; H01S 5/2059; H01S 5/1017; H01S 5/2095; H01L 21/02579; H01L 21/02389; H01L 21/02538; H01L 21/02667; H01L 21/054
USPC ............ 372/102; 438/46, 478, 503, 505, 507, 438/508, 509
See application file for complete search history.

(56) References Cited

U.S. PATENT DOCUMENTS

| | | | | |
|---|---|---|---|---|
| 5,633,193 | A | * | 5/1997 | Baillargeon et al. ............ 438/32 |
| 7,499,480 | B2 | | 3/2009 | Nagatomo ............... 372/50.124 |

(Continued)

FOREIGN PATENT DOCUMENTS

| | | |
|---|---|---|
| JP | 08-274406 | 10/1996 |
| JP | 2001-358075 | 12/2001 |

(Continued)

OTHER PUBLICATIONS

Ma et al., "Dopant Transport During Semiconductor Crystal Growth with Magnetically Damped Buoyant Convection," 1997, Journal of Crystal Growth, 172, 124-135.*

(Continued)

*Primary Examiner* — Julio J Maldonado
*Assistant Examiner* — Joshua King
(74) *Attorney, Agent, or Firm* — Fitzpatrick, Cella, Harper & Scinto

(57) ABSTRACT

There are provided a process for producing a semiconductor device and a semiconductor device which allow conductivity distribution to be formed without making refractive index distributed even in a material system of a semiconductor difficult to be subjected to ion implantation. The process for producing a semiconductor device includes the steps of forming a semiconductor layer containing a dopant; forming a concave and convex structure on the semiconductor layer by partially removing the semiconductor layer; and forming a conductivity distribution reflecting the concave and convex structure in the semiconductor layer by performing heat treatment on the semiconductor layer in which the concave and convex structure has been formed at a temperature at which a material forming the semiconductor layer causes mass transport and filling up a hole of a concave portion of the concave and convex structure with the material forming the semiconductor layer.

20 Claims, 7 Drawing Sheets

(56) References Cited

U.S. PATENT DOCUMENTS

| | | | |
|---|---|---|---|
| 7,535,946 B2 | 5/2009 | Nagatomo et al. | 372/50.124 |
| 7,796,666 B2 | 9/2010 | Nagatomo | 372/50.124 |
| 7,869,483 B2 | 1/2011 | Uchida et al. | 372/99 |
| 2007/0082457 A1* | 4/2007 | Chou et al. | 438/427 |
| 2009/0074026 A1 | 3/2009 | Nagatomo et al. | 372/50.124 |
| 2009/0225805 A1 | 9/2009 | Nagatomo | 372/99 |
| 2009/0246903 A1* | 10/2009 | Watatani et al. | 438/32 |
| 2011/0039364 A1* | 2/2011 | Kawashima et al. | 438/46 |

FOREIGN PATENT DOCUMENTS

| | | | |
|---|---|---|---|
| JP | 2001358075 A * | 12/2001 | |
| JP | 3430206 B2 | 7/2003 | |
| JP | 2004-111766 | 4/2004 | |
| JP | 2004111766 A * | 4/2004 | |
| JP | 2005-129833 | 5/2005 | |
| WO | WO 02/01608 | 1/2002 | |
| WO | WO 2011013354 A2 * | 2/2011 | |

OTHER PUBLICATIONS

International Search Report, dated Oct. 17, 2011, issued in counterpart International Application No. PCT/JP2010/062983.

Inaba et al., "High-Power 1.55-μm Mass-Transport-Grating DFB Lasers for Externally Modulated Systems", *IEEE Journal on Selected Topics in Quantum Electronics*, vol. 7, No. 2, pp. 152-158 (Mar. 1, 2001), XP002660447.

Z.L. Liau et al., "Surface-energy-induced mass-transport phenomenon in annealing of etched compound semiconductor structures: Theoretical modeling and experimental confirmation," Journal of Applied Physics, vol. 67(5), pp. 2434-2440 (Mar. 1, 1990).

Office Action issued on Apr. 30, 2013 in counterpart Japanese Patent Application No. 2009-178412, with translation.

* cited by examiner

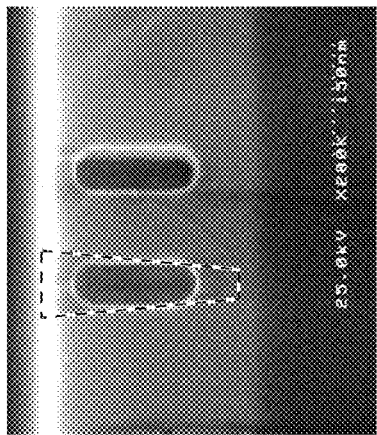
FIG. 2A
FIG. 2B
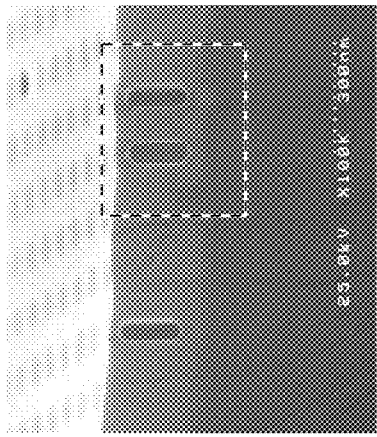
FIG. 2C
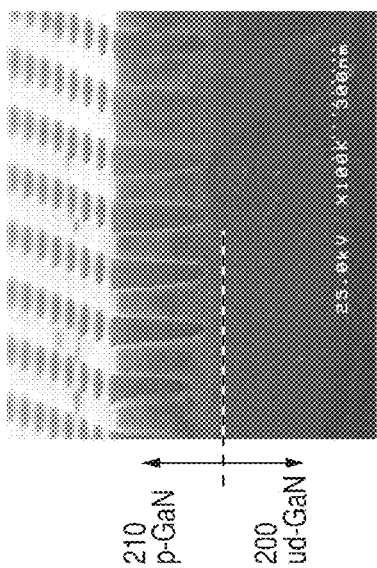
FIG. 2D
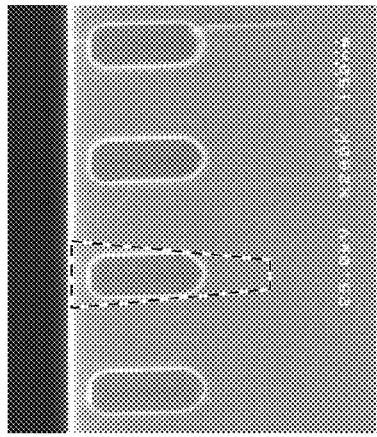
FIG. 2E
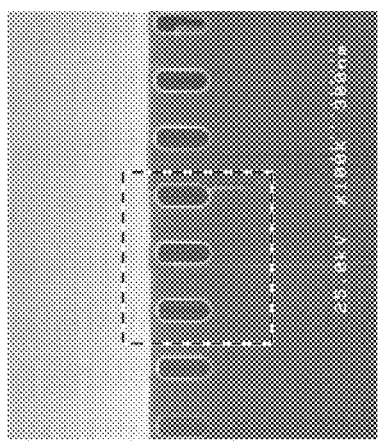

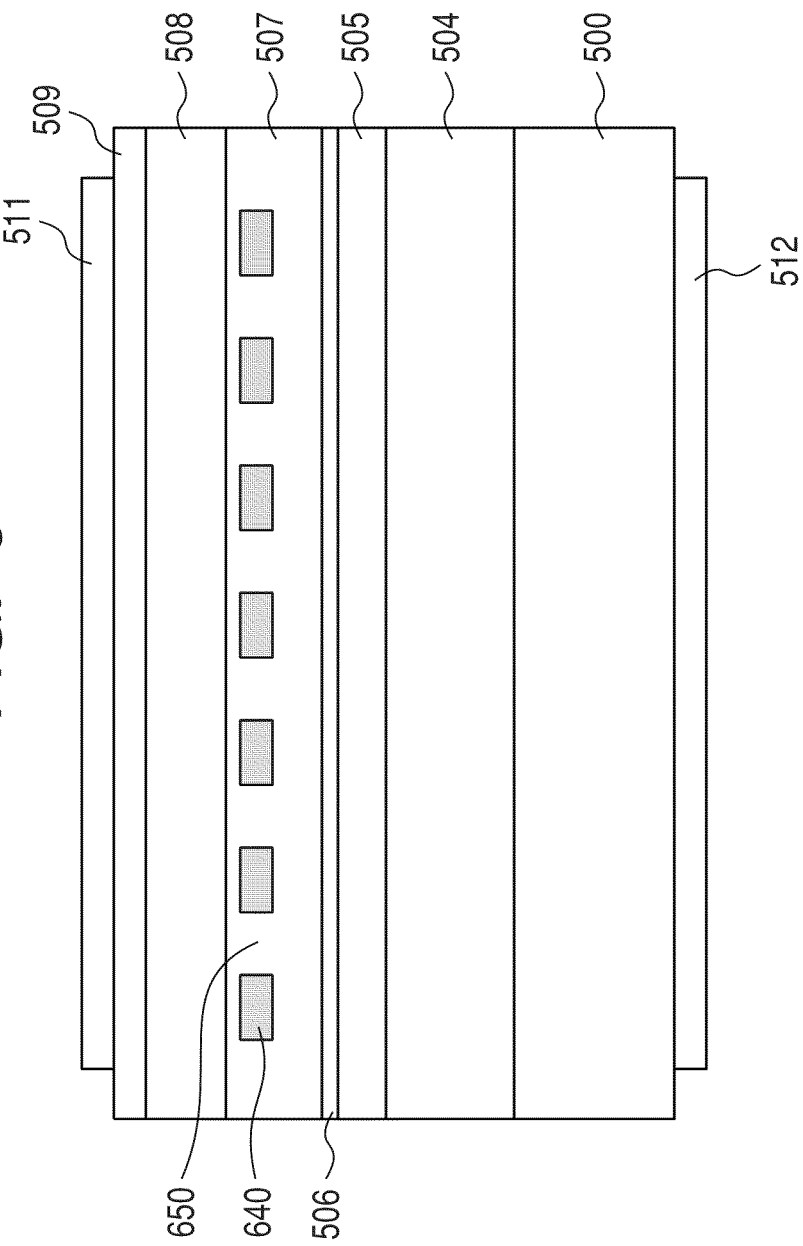

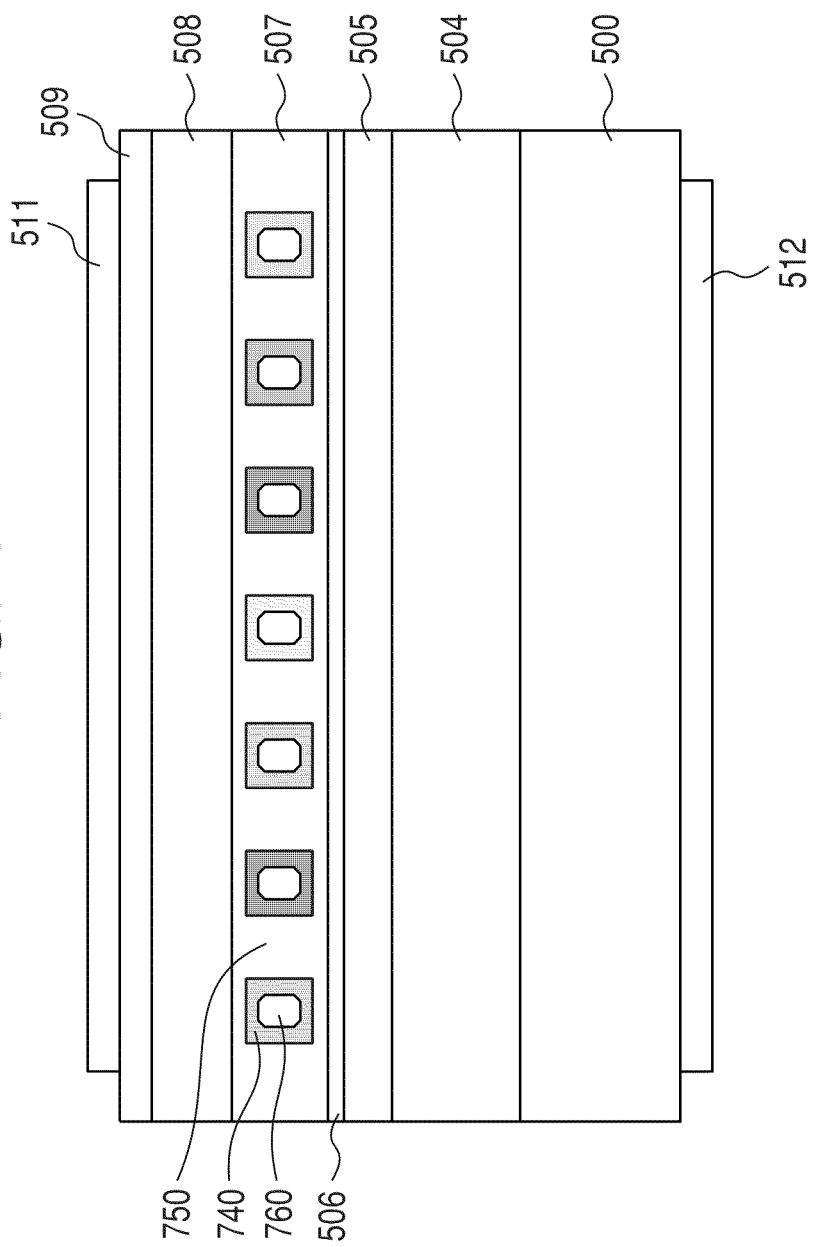

PROCESS FOR PRODUCING SEMICONDUCTOR DEVICE AND SEMICONDUCTOR DEVICE

TECHNICAL FIELD

The present invention relates to a process for producing a semiconductor device and a semiconductor device, and particularly to a process for producing a semiconductor device and a semiconductor device having a plurality of semiconductor regions having different conductivities in an in-plane direction.

BACKGROUND ART

A group III nitride semiconductor is a promising material for a light emitting device in an ultraviolet to visible region and a next-generation advanced electronic device.

In order to make semiconductor devices integrated, it is necessary to form a region with different conductivities in an in-plane direction.

However, it has been known that it is very difficult to perform conductivity control on a very hard material system such as a group III nitride semiconductor by ion implantation after crystal growth.

Conventionally, for example, Japanese Patent No. 3430206 discloses a process for producing a semiconductor device which carries out local conductivity control using mass transport without using ion implantation.

Here, the above described mass transport will be briefly described.

The mass transport is a phenomenon that some of the atoms forming a crystal move by heating and the atoms are rearranged so as to reduce surface free energy.

It has been known that when a concave and convex structure is formed on a semiconductor surface and heated to a predetermined temperature or higher, mass transport occurs, which causes a phenomenon that the corners of the concave and convex structure are rounded or filled up.

A theory and an experimental result of the mass transport are disclosed in Journal of Applied Physics Vol. 67, pp. 2434 (1990), for example.

CITATION LIST

Patent Literature

PTL 1: Japanese Patent No. 3430206

Non Patent Literature

NPL 1: Journal of Applied Physics Vol. 67, pp. 2434 (1990)

SUMMARY OF INVENTION

Technical Problem

According to Japanese Patent No. 3430206, as described above, since it is difficult to perform conductivity control on a material system such as a group III nitride semiconductor by ion implantation after crystal growth, a conductivity distribution reflecting a concave and convex structure formed after crystal growth is formed using mass transport without using ion implantation.

However, as described later, the process for producing a semiconductor device disclosed in Japanese Patent No. 3430206 has a problem that it is difficult to form conductivity distribution without making refractive index distributed.

More specifically, in order to control the region where mass transport occurs, Japanese Patent No. 3430206 uses the difference in mass transport characteristic due to the difference in Al composition.

Here, the more Al is included, the more thermodynamically stable the semiconductor material becomes, and mass transport is difficult to occur. Therefore, it is so constructed that Al is not contained in a region where mass transport is desired to occur; and Al is contained in a region where mass transport is not desired to occur.

However, this construction requires a combination of materials different in Al composition and thus the characteristics other than conductivity are also affected.

For example, a layer containing Al has a smaller refractive index than a layer not containing Al.

Therefore, it is difficult to form conductivity distribution without making refractive index distributed.

Here, the description will be given on an example of a gain-coupled DFB laser (distributed feedback laser) which forms conductivity distribution without producing a refractive index distribution.

The DFB laser is roughly divided into two types: an index-coupled DFB laser (structure whose refractive index is periodically modulated) and a gain-coupled DFB laser (structure whose gain is periodically modulated).

The gain-coupled DFB laser is characterized in that a single mode oscillation is easier and a change in characteristic due to reflected light is smaller in comparison with the index-coupled DFB laser.

However, in order to provide a pure gain-coupled DFB laser, gain or loss needs to be periodically modulated without modulating the refractive index.

Modulation of the density of current injected into an active layer can induce modulation of gain, but the producing process of Japanese Patent No. 3430206 is difficult to produce a structure whose current density is modulated without modulating the refractive index.

In view of the above problems, the present invention has been made, and an object of the present invention is to provide a process for producing a semiconductor device and a semiconductor device which allow conductivity distribution to be formed without making refractive index distributed even in a material system of a semiconductor difficult to be subjected to ion implantation.

Solution to Problem

The present invention provides a process for producing a semiconductor device and a semiconductor device constituted as below.

The process for producing a semiconductor device of the present invention comprises the steps of: forming a semiconductor layer containing a dopant; forming a concave and convex structure on the semiconductor layer by partially removing the semiconductor layer; and forming a conductivity distribution reflecting the concave and convex structure in the semiconductor layer by performing heat treatment on the semiconductor layer in which the concave and convex structure has been formed at a temperature at which a material forming the semiconductor layer causes mass transport and filling up a hole of a concave portion of the concave and convex structure with the material forming the semiconductor layer.

Moreover, a semiconductor device of the present invention comprises a semiconductor device in which a region with different conductivity distributions is formed in an in-plane direction of the semiconductor layer, wherein the semiconductor layer is formed of a semiconductor layer containing a dopant, and a hole of a concave portion of a concave and convex structure formed in the semiconductor layer is filled up with a material forming the semiconductor layer by mass transport, and wherein a conductivity distribution reflecting the concave and convex structure is formed in the semiconductor layer.

Advantageous Effects of Invention

The present invention can provide a process for producing a semiconductor device and a semiconductor device which allow conductivity distribution to be formed without making refractive index distributed even in a material system of a semiconductor difficult to be subjected to ion implantation.

Further features of the present invention will become apparent from the following description of exemplary embodiments with reference to the attached drawings.

BRIEF DESCRIPTION OF DRAWINGS

FIGS. 2A, 2B, 2C, 2D and 2E each are a scanning electron microscope (SEM) photo of a sample in a process of forming a concave and convex structure on a semiconductor surface and performing heat treatment thereon, which is illustrated as a reference drawing for describing an experimental result.

FIG. 6 is a schematic view describing a structure example of a DFB laser using a semiconductor device according to a third example of the present invention.

FIG. 7 is a schematic view describing a structure example of a DFB laser using a semiconductor device according to a fourth example of the present invention.

DESCRIPTION OF EMBODIMENTS

Figure 1A:
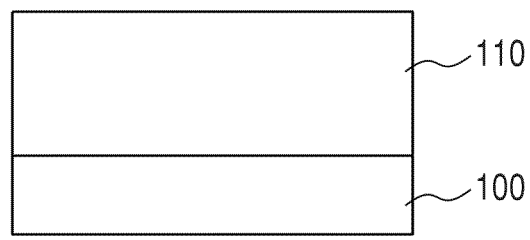
FIGS. 1A, 1B and 1C illustrate a process for producing a semiconductor device according to an embodiment of the present invention.

Hereinafter, embodiments of the present invention will be described.

The finding as described below enables conductivity distribution to be formed without making refractive index distributed in an in-plane direction of the semiconductor layer.

More specifically, the present invention is based on a new finding that when a semiconductor material containing a dopant causes mass transport, the dopant concentration changes before and after movement of atoms.

The present inventors conducted experiments and obtained experimental results suggesting that the dopant concentration of a region in which atoms were moved by mass transport was lower than before the atoms were moved.

Hereinafter, by referring to FIGS. 2A to 2E, the above mentioned experimental results will be described.

FIG. 2A is a photo before heat treatment.

A two-dimensional photonic crystal with a hole pitch of 160 nm, a hole diameter (upper portion) of 90 nm, and a hole depth of 270 nm is formed by electron beam drawing and dry etching.

In the figure, a region 200 below the dotted line is ud-GaN, and a region 210 above the dotted line is Mg-doped p-GaN.

The Mg-doped region 210 appears brighter than the ud-GaN region 200. The SEM photo contrast reflects the concave and convex profile, composition, crystallinity, magnetism, electric potential, or the like. In the SEM photo of FIG. 2A, the reason why the p-GaN 210 appears brighter than the ud-GaN 200 is the difference in Mg composition and the resulting difference in electric potential therefrom. The higher the Mg concentration is, the brighter the SEM photo becomes. Therefore, the Mg concentration can be estimated from the contrast of the SEM photo.

The sample was heated at a temperature of 1025° C. to cause mass transport and a part of the hole was filled up.

FIGS. 2B and 2C illustrate the results. FIG. 2C corresponds to a region enclosed by the dotted line in FIG. 2B. In addition, the dotted trapezoid in FIG. 2C indicates a hole shape before heat treatment.

By referring to FIG. 2B, the contrast reflecting the hole shape before filling up is confirmed on the sample surface. In addition, the inside of the trapezoid in FIG. 2C (i.e., a portion filled up by mass transport) appears darker than the surrounding region. This result suggests that the Mg concentration of the material moved by mass transport is reduced in comparison with the Mg concentration before movement.

As a comparative example, the experimental results using ud-GaN in the same manner are illustrated in FIGS. 2D and 2E. Here, the contrast observed in FIGS. 2B and 2C was not observed.

The difference between the p-GaN and the ud-GaN used in this experiment is only whether Mg is doped or not.

Therefore, it can be concluded that the contrast reflecting the concave and convex structure before heat treatment, observed after mass transport caused by heat treatment, represents the difference in doped Mg concentration.

A low dopant concentration means a low carrier concentration in the semiconductor, leading to an increase in electrical resistance.

Therefore, conductivity distribution can be controlled by intentionally changing the dopant concentration.

Moreover, the dopant concentration is smaller than the concentration of the semiconductor material of the base material by several orders of magnitude, and thus a certain change in dopant concentration involves a very small change in refractive index.

Therefore, the present invention can provide a structure whose conductivity is modulated with a uniform refractive index.

The present invention is based on the above findings and provides a process for producing a semiconductor device and a semiconductor device utilizing such findings.

Figure 1B:
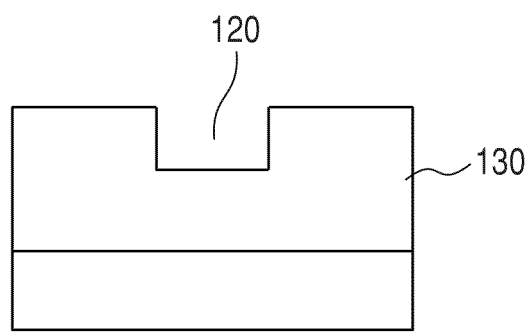
Figure 1C:
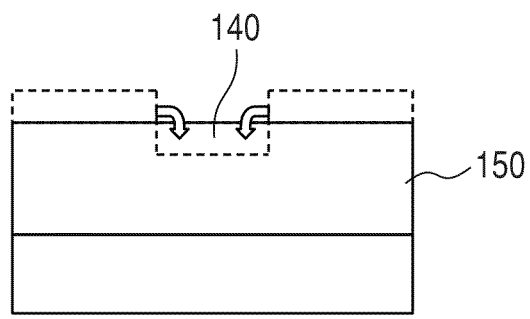

Next, by referring to FIGS. 1A to 1C, the description will focus on the process for producing a semiconductor device according to the present embodiment. First, as illustrated in FIG. 1A, a semiconductor layer 110 containing a dopant is formed on a substrate 100.

Subsequently, as illustrated in FIG. 1B, a part of the semiconductor layer 110 is removed by lithography and etching to form a concave and convex structure having a concave portion 120 and a convex portion 130 on the semiconductor layer.

Subsequently, heat treatment is performed at a temperature at which the semiconductor material causes mass transport to fill up the hole of the depressed portion of the concave and convex structure.

The shape after filling up is formed so as to reduce surface free energy, and thus does not always reflect the concave and convex structure, but may be mostly a flat shape as illustrated by a solid line in FIG. 1C.

However, as described above, the dopant concentration after filling up reflects the concave and convex structure.

Thus, a conductivity distribution reflecting the concave and convex structure can be formed in the semiconductor layer. More specifically, the dopant concentration is low in a region 140 corresponding to the concave portion before filling up and the dopant concentration is higher in a region 150 corresponding to the convex portion before filling up in comparison with the region 140.

The reason why the dopant concentration becomes low after mass transport is mostly unknown, but is supposed such that when a crystal is decomposed by heat treatment and atoms are moved, a phenomenon occurs that the dopant is diffused in the atmospheric gas. As a result, the dopant concentration is not changed in a region in which atoms are not moved, and the dopant concentration is reduced in a region to which atoms are moved.

When mass transport is caused by heat treatment, a part or all of a hole is filled up. How much of the hole is filled up depends on the aspect ratio and the side wall verticality of the concave and convex structure before heat treatment, the heat treatment temperature, the heat treatment time, and the like.

More specifically, the smaller the aspect ratio, the smaller the side wall inclination to the substrate surface (i.e., worse verticality), the higher the heat treatment temperature, and the longer the heat treatment time, the easier the hole is filled up completely without voids. Of them, it is the aspect ratio that has the greatest effect. If the aspect ratio is defined as the ratio between the depth and the width of a concave portion of a striped concave and convex structure, the aspect ratio required to fill up the concave portion completely without voids is preferably equal to or less than 1.

If the above conditions are appropriately set, a structure only whose side wall portion is filled up can be formed.

Figure 3A:
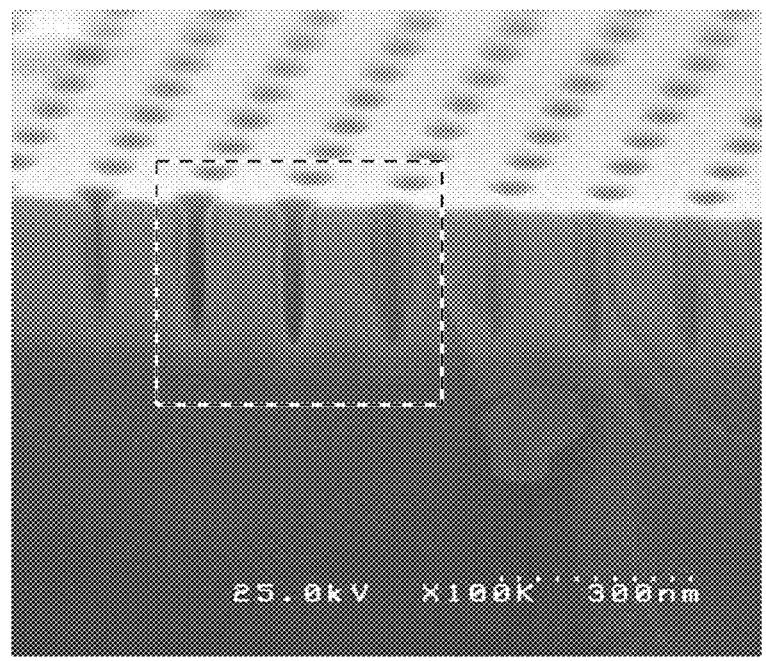
FIGS. 3A and 3B each are an SEM photo of a sample prepared by performing heat treatment on the same structure illustrated in FIG. 2A as the reference drawing for 30 minutes at 900° C. for describing an experimental result.
Figure 3B:
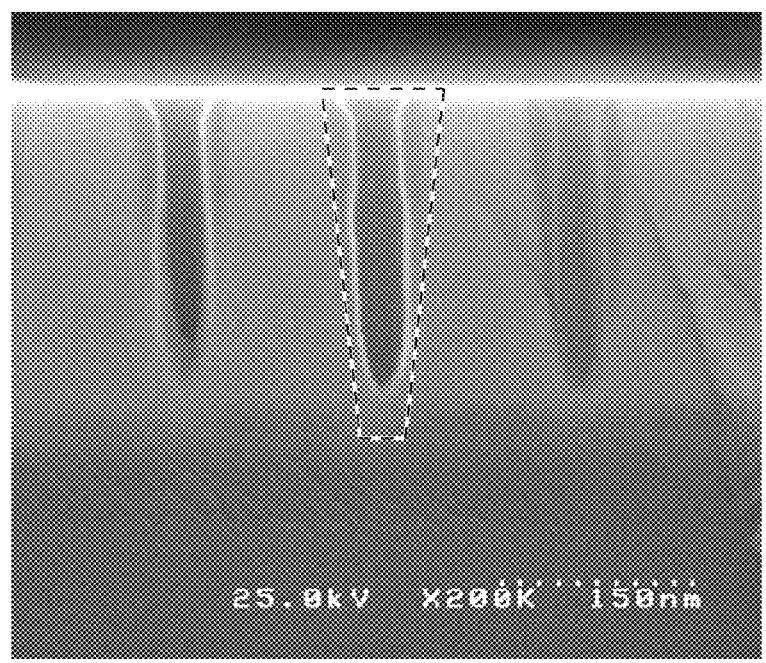

FIGS. 3A and 3B each illustrate an SEM photo of a sample prepared by performing heat treatment at a temperature of 900° C. for 30 minutes on the same structure as the structure illustrated in FIG. 2A. FIG. 3B corresponds to a region enclosed by the dotted line in FIG. 3A. In addition, the dotted trapezoid in FIG. 3B indicates a hole shape before heat treatment.

Around the hole, the inside region of the trapezoid (i.e., a portion filled up by mass transport) appears darker than the outside of the trapezoid.

More specifically, the inside region has a low Mg concentration and a high resistance in comparison with the outside of the trapezoid.

An advantage of forming this structure is that current flowing near the hole surface can be reduced and thereby a loss such as non-radiative recombination on the surface can be suppressed.

The semiconductor material used as the base material according to present invention is not limited to a particular material, but may be any material which can cause mass transport by heat treatment.

Well known examples of the semiconductor materials causing mass transport include a group III-V semiconductor such as GaN, InP, and GaAs.

A generally available material can be used as the dopant. Examples of the n-type dopant include Si, Ge, Se, S, Sn, Te, and C. Examples of the p-type dopant include Mg, Be, Zn, Cd, Ca, Sr, and Ba.

Only one of the above dopants may be contained, or a plurality of dopants may be contained at the same time.

Moreover, either one or both of the p-type dopant and the n-type dopant may be contained.

If a plurality of dopants are contained, the relative concentration may be changed before and after mass transport.

The cause for this is that the interatomic bond cleavability in a crystal and the mobility on the crystal surface are different depending on the dopant type.

Thus, the carrier concentration after mass transport and the difference between the p-type and the n-type can be precisely controlled by appropriately designing each dopant concentration before mass transport.

When a group III-V semiconductor is used, heat treatment for causing mass transport is generally performed in a group V material gas atmosphere.

For example, when a MOVPE apparatus is used to perform heat treatment on GaN, the heat treatment is performed in a mixed atmosphere of nitrogen and hydrogen used as the carrier gas and ammonia which is a group V material gas. The concave and convex structure can be formed by a general lithography and etching process. For example, photolithography or electron beam lithography can be used as the lithography.

Wet etching or dry etching can be used as the etching. A chemical solution or etching gas suitable for each semiconductor material to be processed is used.

EXAMPLES

Hereinafter, examples of the present invention will be described.

Example 1

By referring to FIGS. 4A to 4F, a process for producing a semiconductor device according to the present example will be described.

In FIGS. 4A to 4F, are illustrated a sapphire substrate 400, a ud-GaN buffer layer 401, an n-GaN layer 402, a photoresist 403, a concave portion 420, and a convex portion 430.

Figure 4A:
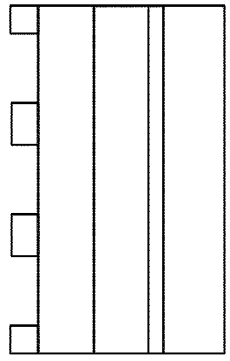
FIGS. 4A, 4B, 4C, 4D, 4E and 4F illustrate a producing process according to a first example of the present invention.
Figure 4B:
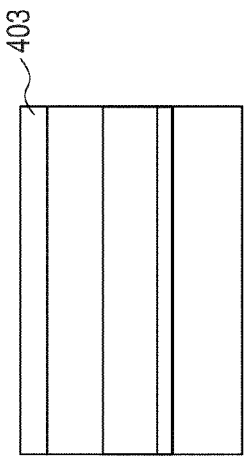

First, as illustrated in FIG. 4A, a multi-layer wafer of group III nitride semiconductors is formed by a MOVPE apparatus.

Then, the ud-GaN buffer layer 401 is formed on the sapphire substrate 400, on which the Si-doped n-GaN layer 402 and the Mg-doped p-GaN layer 410 are grown.

Here, the Mg concentration of the p-GaN layer 410 was designed to be about $4 \times 10^{19}$ cm$^{-1}$. After growth, the wafer was taken out of a growth furnace and was annealed for five minutes at a temperature of 900° C. in a nitrogen atmosphere to activate Mg.

Figure 4D:
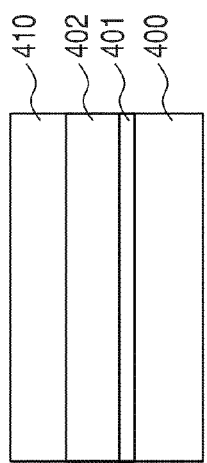
Figure 4C:
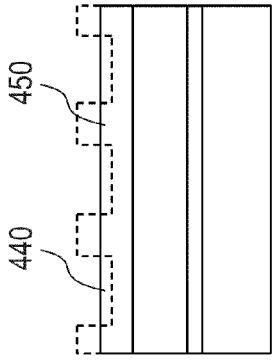
Figure 4E:
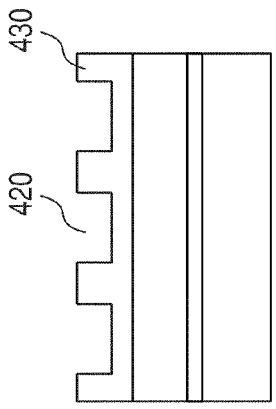

Subsequently, a photoresist 403 was applied to the wafer surface (FIG. 4B); a striped pattern was formed by photolithography (FIG. 4C); and a pattern was transferred to a p-GaN surface by ICP-RIE using chlorine gas (FIG. 4D).

The striped concave portion 420 formed on the p-GaN surface was 10 μm wide and 1 μm deep. The remaining photoresist is removed by sulfuric acid-hydrogen peroxide mixture rinsing (FIG. 4E); then ultrasonic cleaning using an organic solvent and an alkaline solution was performed; and then the wafer was introduced into the MOVPE apparatus again to perform heat treatment.

Figure 4F:
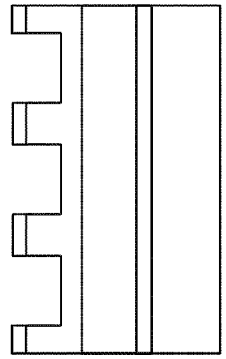

Heat treatment was performed for five minutes at a temperature of 1000° C. in an nitrogen and ammonia atmosphere to cause mass transport and fill up the striped pattern (FIG. 4F).

As described above, the smaller the aspect ratio of the concave and convex structure (the ratio between the depth and the width of a groove), the easier the hole of the concave portion of the concave and convex structure is filled up completely without voids. According to the present example, the aspect ratio is relatively small such as 0.1, and thus the pattern is filled up without voids.

As illustrated in FIG. 4F, the shape after filling up is approximately flat, but the concentration of Mg which is a dopant reflects the striped pattern, whereby a structure whose conductivity is modulated in the striped pattern is provided.

The Hall effect was measured to measure the electrical resistance of each region. The electrical resistivity of the region 450 corresponding to the convex portion before filling up was 1.2 Ωcm, but the electrical resistance of the region 440 corresponding to the concave portion was too large to be measured by our measuring apparatus.

Example 2

Figure 5:
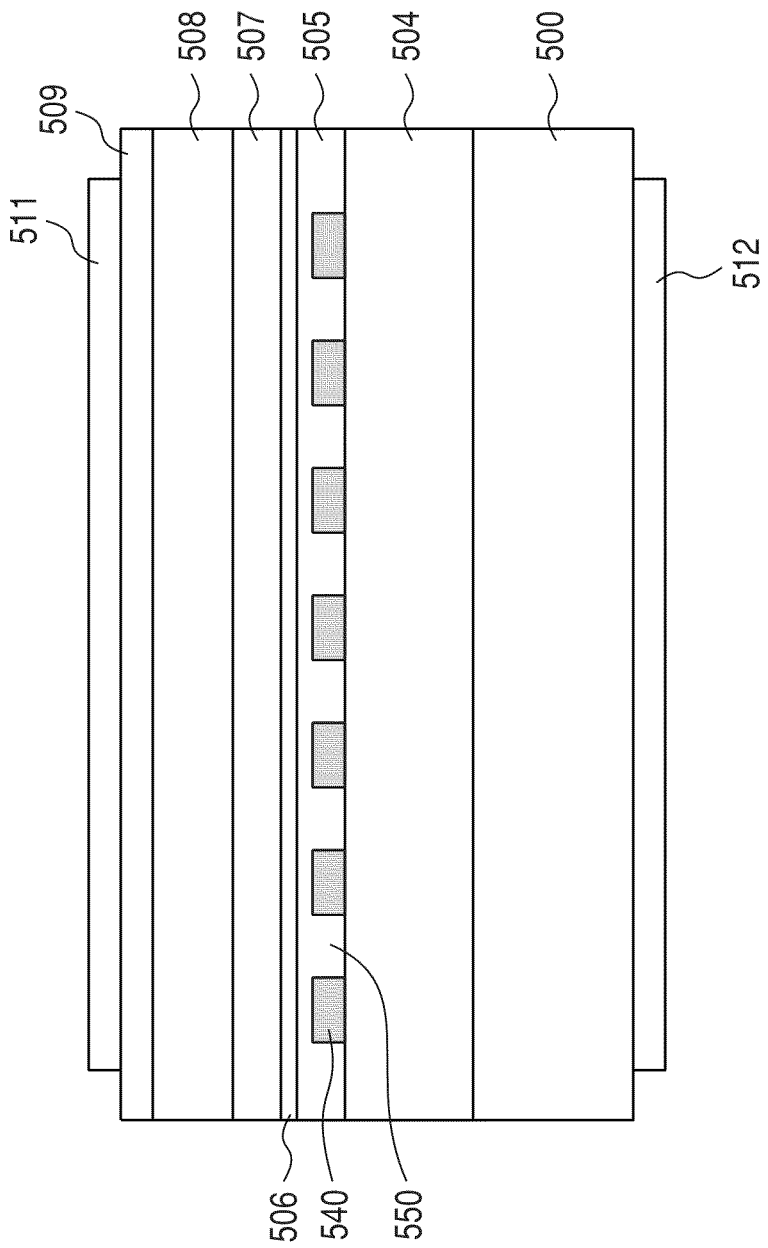
FIG. 5 is a schematic view describing a structure example of a DFB laser using a semiconductor device according to a second example of the present invention.

By referring to FIG. 5, a structure example of a DFB laser using a semiconductor device according to the present example will be described.

In particular, the present example focuses on a gain-coupled DFB laser made of a semiconductor device produced by the same producing process as the producing process described in example 1. The gain-coupled DFB laser according to the present example is designed to be operated near a wavelength of 405 nm.

On an n-type GaN substrate 500, there were laminated an n-$Al_{0.07}Ga_{0.93}N$ cladding layer 504, an n-GaN layer 505, an active layer 506, a p-GaN layer 507, a p-$Al_{0.07}Ga_{0.93}N$ cladding layer 508, and a $p^+$-GaN contact layer 509.

In addition, a p-electrode 511 and an n-electrode 512 were provided on the top and the bottom thereof respectively.

In the n-GaN layer 505, there were formed a high resistance region 540 and a low resistance region 550 by the same producing process as the producing process described in example 1.

The high resistance region 540 and the low resistance region 550 form a periodic structure using the half length of a laser oscillation wavelength as one period.

When a voltage is applied to the upper and lower electrodes, current flows. At this time, the current flows so as to avoid the high resistance region 540 and thereby a periodic current density distribution is formed.

When the current injected in the active layer 506 is periodically modulated, a periodic modulation of gain occurs, and thus the DFB laser of the present example operates as the gain-coupled DFB laser.

If the distance between the high resistance region 540 and the active layer 506 is too far, the current spreads and the current density in the active layer 506 becomes uniform. Thus, the DFB laser does not operate as the gain-coupled DFB laser.

In order to prevent this, the distance between the high resistance region 540 and the active layer 506 needs to be set close enough not to spread the current. According to the present example, the distance was set to 10 nm.

According to the present example, the high resistance region 540 was filled up without voids, and thus refractive index modulations are caused to a negligible extent, if any, could be substantially ignored.

Thus, a pure gain-coupled DFB laser only whose gain was modulated was achieved.

Note that the high resistance region and the low resistance region according to the present example form a periodic structure using the half length of a laser oscillation wavelength as one period, but even a periodic structure using an integer multiple of the half length of the laser oscillation wavelength as one period can operate as the gain-coupled DFB laser.

Example 3

By referring to FIG. 6, a structure example of a DFB laser using a semiconductor device according to the present example will be described.

In particular, the present example focuses on a gain-coupled DFB laser made of a semiconductor device produced by the same producing process as the producing process described in example 1 but different in structure from the example 2.

The gain-coupled DFB laser according to the present example is designed to be operated near a wavelength of 405 nm.

The present example is different from the example 2 in the following two points:
(1) A high resistance region 640 is formed not in the n-GaN layer 505 but in the p-GaN layer 507.
(2) The high resistance region 640 is 100 nm far from the active layer 506 and the current density of the active layer 506 is uniform.

The reason and advantages of the above mentioned differences will be described below.

In example 2, a periodic structure of gain by the current density distribution is formed, but in the present example, the distance between the high resistance region and the active layer is large and thus the current density of the active layer is approximately uniform. Thus, instead of the current density, the degree of light absorption is so configured as to have a periodic structure.

More specifically, the net gain obtained by subtracting loss from gain is periodically modulated. Thereby, the gain-coupled DFB laser is enabled.

In general, a semiconductor containing a dopant shows a higher light absorption than an undoped semiconductor. The light absorption coefficient of ud-GaN is about 10 $cm^{-1}$ at a wavelength of 400 nm, but the absorption coefficient of Si-doped n-GaN is about 30 $cm^{-1}$ and the light absorption coefficient of Mg-doped p-GaN is further increased to about 100 $cm^{-1}$.

Therefore, as illustrated in FIG. 6, formation of a periodic structure of dopant concentration allows a periodic structure of light absorption to be formed. In order to increase the modulation, use of p-GaN is more advantageous than the use of n-GaN.

The present example has an advantage over the example 2 in that the distance between the high resistance region 640 and the active layer 506 can be relatively large.

In the structure of example 2, if the concave and convex structure is not sufficiently flat after mass transport, the active layer grown thereon may be damaged. In order to avoid this problem, when the concave and convex structure is fabricated after the active layer is grown, it is necessary to dig in near the active layer by dry etching. As a result, the active layer may be damaged.

In contrast to this, according to the structure of the present example, a uniform current density of the active layer does not cause any problem and thus the distance between the high resistance region and the active layer can be relatively large.

Thus, the present example can produce a structure less damaging the above mentioned active layer.

As described above, the distance between the high resistance region and the active layer is desirably far enough not to damage the active layer.

However, if the distance is too far, light guided near the active layer cannot sense a periodic structure of dopant concentration made of the high resistance region and the low resistance region and thus cannot be optically coupled.

Thus, the gain-coupled DFB laser is disabled. In the present example, as an appropriate distance, the distance between the high resistance region and the active layer is set to 100 nm.

Example 4

By referring to FIG. 7, a structure example of a DFB laser using a semiconductor device according to the present example will be described.

In particular, the present example focuses on an index-coupled DFB laser made of a semiconductor device produced by the same producing process as the producing process described in example 1.

The index-coupled DFB laser according to the present example was designed to be operated near a wavelength of 405 nm.

The index-coupled DFB laser structure of the present example is substantially the same structure as the structure of example 3, but is differently configured as follows.

More specifically, the present example is different from example 3 in that the hole of a concave portion of the concave and convex structure is covered with a material forming the semiconductor layer so as to surround a void remaining therein, and thus a void 760 remains in a high resistance region 740.

In order to leave a void, the aspect ratio of the concave and convex structure formed before heat treatment needs to be increased. The present example formed a striped concave portion with an aspect ratio of 3 and then performed heat treatment.

As a result, a structure was formed such that the high resistance region 740 surrounded the void 760.

Since voids are periodically arranged, the DFB laser of the present example operates as an index-coupled DFB laser.

The difference from a general index-coupled DFB laser is that each void is surrounded by a high resistance region.

In such a structure, a region covered with a material forming the semiconductor layer so as to surround the void has a lower dopant concentration than a region further surrounding the region.

For this reason, current flowing near an interface between the void and the semiconductor can be reduced and as a result, non-radiative recombination on the interface can be suppressed.

Thus, the index-coupled DFB laser operating with less loss and low threshold can be realized.

Hereinbefore, each example of the present invention has been described, but the semiconductor device and the producing process of the present invention are not limited to these examples.

The semiconductor materials and the shape of the concave and convex structure can be appropriately modified within the scope of the present invention.

The above examples use a laser oscillation wavelength of 405 nm, but any oscillation wavelength may be used by selection of an appropriate material and structure.

The above examples focus on the DFB laser, but the present invention can be applied not only the laser but also any device operating as an optical wavelength filter or an optical amplifier with the same structure.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-178412, filed Jul. 30, 2009, which is hereby incorporated by reference herein in its entirety.

The invention claimed is:

1. A semiconductor device comprising:
a semiconductor layer in which a region with different conductivity distributions is formed in an in-plane direction of said semiconductor layer,
wherein said semiconductor layer is configured of a semiconductor layer containing a dopant, and at least a part of a hole of a concave portion of a concave and convex structure formed in said semiconductor layer is filled up with a material forming said semiconductor layer by mass transport, and
wherein a conductivity distribution reflecting said concave and convex structure is formed in said semiconductor layer,
wherein a first region corresponding to the concave portion of said concave and convex structure filled up with said material forming said semiconductor layer and a second region corresponding to the convex portion of said concave and convex structure have a same element as dopant, and
wherein a concentration of said same element in said first region is lower than that in said second region.

2. The semiconductor device according to claim 1, wherein the hole of said concave portion of said concave and convex structure is filled up with said material forming said semiconductor layer without voids.

3. The semiconductor device according to claim 1, wherein said hole of said concave portion of said concave and convex structure is covered with said material forming said semiconductor layer so as to surround a void remaining therein, and
a concentration of said same element of a region covered with said material forming said semiconductor layer is lower than that in a region further surrounding said region covered with said material forming said semiconductor layer.

4. The semiconductor device according to claim 1, wherein said concave and convex structure forms a periodic structure.

5. The semiconductor device according to claim 4, wherein said semiconductor layer in which said concave and convex structure has been formed is a semiconductor layer constituting a DFB laser, and said concave and convex structure forms a periodic structure of said DFB laser with an integer multiple of a half length of a laser oscillation wavelength as one period.

6. The semiconductor device according to claim 5, wherein said semiconductor layer in which said concave and convex structure has been formed is a semiconductor layer constituting the DFB laser containing an active layer, and said concave and convex structure has a structure in which a current density distribution in said active layer is periodically modulated with an integer multiple of a half length of a laser oscillation wavelength as one period.

7. The semiconductor device according to claim 4, wherein said semiconductor layer in which said concave and convex structure has been formed is a semiconductor layer constituting a DFB laser containing an active layer, and said semiconductor layer is arranged apart from said active layer by such a distance that said semiconductor layer is able to be optically coupled with said active layer.

8. The semiconductor device according to claim 1, wherein said semiconductor layer is made of a group III nitride semiconductor not containing Al.

9. The semiconductor device according to claim 1, wherein said dopant contains either one of a p-type and an n-type dopant.

10. The semiconductor device according to claim 1, wherein said dopant contains both p-type and n-type dopants.

11. The semiconductor device according to claim 1, wherein the hole of said concave portion of said concave and convex structure is covered with said material forming said semiconductor layer so as to surround a void remaining therein.

12. The semiconductor device according to claim 1, wherein an aspect ratio between a depth and a width of said concave portion of said concave and convex structure is equal to or less than 1.

13. The semiconductor device according to claim 1, wherein said same element is at least one of Si, Ge, Se, S, Sn, Te and C.

14. The semiconductor device according to claim 1, wherein said same element is at least one of Mg, Be, Zn, Cd, Ca, Sr and Ba.

15. The semiconductor device according to claim 1, wherein said same element is Mg.

16. A process for producing a semiconductor device comprising the steps of:
   forming a semiconductor layer containing a dopant;
   forming a concave and convex structure on the semiconductor layer by partially removing the semiconductor layer; and
   forming a conductivity distribution reflecting the concave and convex structure in the semiconductor layer by performing heat treatment on the semiconductor layer in which the concave and convex structure has been formed at a temperature at which a material forming the semiconductor layer causes mass transport and filling up at least a part of a hole of a concave portion of the concave and convex structure with the material forming the semiconductor layer,
   wherein a first region corresponding to the concave portion of the concave and convex structure filled up with the material forming the semiconductor layer and a second region corresponding to the convex portion of the concave and convex structure have a same element as dopant, and
   wherein a concentration of the same element in the first region is lower than that in the second region.

17. The process according to claim 1, wherein said step of forming a concave and convex structure comprises forming the concave and convex structure so that an aspect ratio between a depth and a width of the concave portion of the concave and convex structure is equal to or less than 1.

18. The semiconductor device according to claim 1, wherein said same element is at least one of Si, Ge, Se, S, Sn, Te and C.

19. The semiconductor device according to claim 1, wherein said same element is at least one of Mg, Be, Zn, Cd, Ca, Sr and Ba.

20. The semiconductor device according to claim 1, wherein said same element is Mg.

* * * * *